US012677624B2

(12) United States Patent
Hyun et al.

(10) Patent No.: US 12,677,624 B2
(45) Date of Patent: Jul. 7, 2026

(54) COOLING UNIT, APPARATUS FOR PROCESSING A SUBSTRATE AND METHOD OF PROCESSING A SUBSTRATE

(71) Applicant: SEMES CO., LTD., Cheonan-si (KR)

(72) Inventors: Jaeil Hyun, Cheonan-si (KR); Gihong Park, Cheonan-si (KR); Jaesung Ju, Cheonan-si (KR); Jooyoung Lee, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 628 days.

(21) Appl. No.: 18/146,699

(22) Filed: Dec. 27, 2022

(65) Prior Publication Data

US 2023/0207347 A1 Jun. 29, 2023

(30) Foreign Application Priority Data

Dec. 28, 2021 (KR) .......................... 1020210189886
May 12, 2022 (KR) .......................... 1020220058130

(51) Int. Cl.
H10P 72/00 (2026.01)
G03F 7/00 (2006.01)
H10P 72/30 (2026.01)
H10P 76/00 (2026.01)

(52) U.S. Cl.
CPC ...... H10P 72/0434 (2026.01); G03F 7/70875 (2013.01); H10P 72/30 (2026.01); H10P 76/00 (2026.01)

(58) Field of Classification Search
CPC ............. H01L 21/677; H01L 21/67748; H01L 21/67706; H01L 21/67736; G03F 7/70875; G03F 7/168; G03F 7/38; G03F 7/40
See application file for complete search history.

(56) References Cited

U.S. PATENT DOCUMENTS 4,924,800 A * 5/1990 Tanaka ...................... G03F 7/16
118/58
6,004,047 A * 12/1999 Akimoto ................. G03F 7/162
118/52

(Continued)

FOREIGN PATENT DOCUMENTS

JP 2002-368060 A 12/2002
JP 2004296773 A * 10/2004

(Continued)

OTHER PUBLICATIONS

Japanese Office Action dated Jan. 9, 2024 issued in corresponding Japanese Appln. No. 2022-205374 (with English translation).

*Primary Examiner* — Lionel Nouketcha
(74) *Attorney, Agent, or Firm* — Harness, Dickey & Pierce, P.L.C.

(57) ABSTRACT
An apparatus for processing a substrate may include a heating plate configured to heat a substrate placed thereon, a cooling conveyor including a conveyor configured to transfer a heated substrate, and a first cooling part configured to cool the heated substrate while transferring the heated substrate on the conveyor and configured to provide a cooling atmosphere relative to the heated substrate over the conveyor, and a transfer part configured to transfer the heated substrate from the heating plate onto the conveyor.

20 Claims, 2 Drawing Sheets

(56)                   References Cited

U.S. PATENT DOCUMENTS

| | | | | |
|---|---|---|---|---|
| 6,276,072 | B1 * | 8/2001 | Morad | H01L 21/67115 |
| | | | | 34/61 |
| 7,797,855 | B2 * | 9/2010 | Fukuoka | C30B 35/00 |
| | | | | 414/217 |
| 10,082,346 | B2 * | 9/2018 | Elser | F28F 9/00 |
| 2011/0263070 | A1 * | 10/2011 | Schaeffer | H10F 77/123 |
| | | | | 118/66 |

FOREIGN PATENT DOCUMENTS

| | | | |
|---|---|---|---|
| JP | 2008-053454 | A | 3/2008 |
| JP | 2008-311624 | A | 12/2008 |
| JP | 2009-019832 | A | 1/2009 |
| JP | 2009-158792 | A | 7/2009 |
| KR | 101053563 | B1 | 8/2011 |
| KR | 101546320 | B1 | 8/2015 |
| KR | 101685095 | B1 | 12/2016 |
| KR | 10-2017-0010344 | A | 1/2017 |
| KR | 10-2018-0070755 | A | 6/2018 |
| KR | 10-2020-0006468 | A | 1/2020 |

* cited by examiner

1

COOLING UNIT, APPARATUS FOR PROCESSING A SUBSTRATE AND METHOD OF PROCESSING A SUBSTRATE

CROSS-REFERENCE TO RELATED APPLICATION

This application claims priorities to Korean Patent Application No. 2021-0189886 filed on Dec. 28, 2021 and Korean Patent Application No. 2022-0058130 filed on May 12, 2022 in the Korean Intellectual Property Office (KIPO), the contents of which are herein incorporated by reference in their entireties.

BACKGROUND

1. Field

Example embodiments of the invention relate to a cooling unit, an apparatus for processing a substrate and a method of processing a substrate. More particularly, example embodiments of the invention relate to a cooling unit capable of efficiently cooling a heated substrate, an apparatus for processing a substrate including such a cooling unit, and method of processing a substrate using the apparatus for processing a substrate including the cooling unit.

2. Related Technology

To manufacture a display device or a semiconductor device, a process of heating a substrate and a process of cooling a heated substrate can be frequently performed. For example, a substrate may be heated to a relatively high temperature, and then a heated substrate may be cooled to a relatively low temperature before and after coating a photoresist film on the substrate or providing a developing solution onto the substrate.

The heating process and the cooling process may be vary frequently performed in manufacturing of the semiconductor device or the display device so that the entire process time of manufacturing processes for the semiconductor device or the display device may be significantly increased in case that the process time of the heating process and/or the cooling process is extended. Further, the conventional apparatus for processing a substrate may include a transfer part for simultaneously loading and unloading onto and from a heating unit and a cooling unit such that particles may be generated on the substrate during the simultaneous loading and unloading of the substrate.

SUMMARY

It is one object of the invention to provide a cooling unit capable of reducing a process time of a process of treating a substrate and preventing a generation of particle.

It is another object of the invention to provide an apparatus for processing a substrate including a cooling unit capable of reducing a process time of a process of treating a substrate and preventing a generation of particle.

It is still another object of the invention to provide a method of processing a substrate capable of reducing a process time thereof and preventing a generation of particle.

According to an aspect of the invention, there is provided a cooling unit wherein the cooling unit may include a conveyor configured to transfer a substrate, and a first cooling part configured to cool the substrate while transferring the substrate on the conveyor and configured to provide a cooling atmosphere relative to the substrate over the conveyor.

In example embodiments, the first cooling part may be configured to provide a cool air onto the substrate over the conveyor.

In some example embodiments, the cooling unit may additionally include a second cooling part configured to provide another cooling atmosphere relative to the substrate under the conveyor.

In some example embodiments, the cooling unit may additionally include a third cooling part configured to provide still another cooling atmosphere relative to the substrate at a side of the conveyor.

In some example embodiments, the second cooling part may be configured to allow a cooling fluid to flow under the substrate and the third cooling part may be configured to provide a cool air onto a side of the substrate.

According to another aspect of the invention, there is provided an apparatus for processing a substrate wherein the apparatus for processing a substrate may include a heating plate configured to heat a substrate placed thereon, a cooling conveyor including a conveyor configured to transfer a heated substrate, and a first cooling part configured to cool the heated substrate while transferring the heated substrate on the conveyor and configured to provide a cooling atmosphere relative to the heated substrate over the conveyor, and a transfer part configured to transfer the heated substrate from the heating plate onto the conveyor.

In example embodiments, the heating plate may be configured to have a multi stage structure including at least two plates and the transfer part may be configured to have a multi stage structure including at least two blades corresponding to the at least two plates.

In some example embodiments, when the substrate is not placed on one plate of the at least two plates and a process of heating the substrate placed on another plate of the at least two plates is completed, one blade of the at least two blades may load a substrate on the one plate and another blade of the at least two blades may unload the heated substrate from the another plate.

In example embodiments, the first cooling part may be configured to provide a cool air onto the substrate over the conveyor.

In some example embodiments, the apparatus for processing a substrate may additionally include a second cooling part configured to provide another cooling atmosphere relative to the substrate under the conveyor, and a third cooling part configured to provide still another cooling atmosphere relative to the substrate at a side of the conveyor.

In some example embodiments, the second cooling part may be configured to allow a cooling fluid to flow under the substrate and the third cooling part may be configured to provide a cool air onto a side of the substrate.

According to still another aspect of the invention, there is provided a method of processing a substrate. In the method of processing a substrate, a substrate in a stationary state at a first position may be heated, a heated substrate may be transferred from the first position to a second position adjacent to the first position, the heated substrate may be transferred from the second position to a third position relatively away from the first position, and the heated substrate may be cooled while transferring the heated substrate from the second position to the third position.

In some example embodiments, two first positions may be provided in an apparatus for processing a substrate, and substrates may be sequentially loaded at the two first positions and the substrates may be sequentially unloaded from the two first positions.

In some example embodiments, when a substrate is not loaded at one first position of the two first positions and a process of heating the substrate loaded at another first position of the two first positions is completed, a substrate may be loaded at the one first position and the heated substrate may be unloaded from the another first position.

In some example embodiments, the two first positions may exist on two plates, respectively, and the substrates may be sequentially transferred from the two plates using two blades corresponding the two blades, respectively.

In example embodiments, the heated substrate may be transferred from the second position to the third position using a conveyor.

IN example embodiments, the heated substrate may be cooled by providing a cool air onto the heated substrate while transferring the heated substrate from the second position to the third position.

In some example embodiments, additional cooling atmospheres may be provided at a side of the conveyor and under the conveyor while transferring the heated substrate from the second position to the third position.

In some example embodiments, a cool air may be provided onto a side of the heated substrate and a cooling fluid may flow under the conveyor.

In example embodiments, the method of processing a substrate may include a process of coating a chemical liquid including a photoresist on the substrate or a process of providing a chemical liquid including a developing solution onto the substrate.

According to example embodiments, the apparatus for processing a substrate may reduce the process steps performed using the transfer part, and thus the apparatus for processing a substrate may efficiently reduce the process time of the process of treating a substrate. Additionally, the apparatus for processing a substrate may reduce the movement of the substrate in the process steps so that the apparatus for processing a substrate may prevent the generation of particles in the process of treating a substrate. Furthermore, the apparatus for processing a substrate may reduce manufacturing costs for a display device or a semiconductor device since the apparatus for processing a substrate may include the relatively inexpensive cooling conveyor instead of the conventional multi stage cooling plates.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
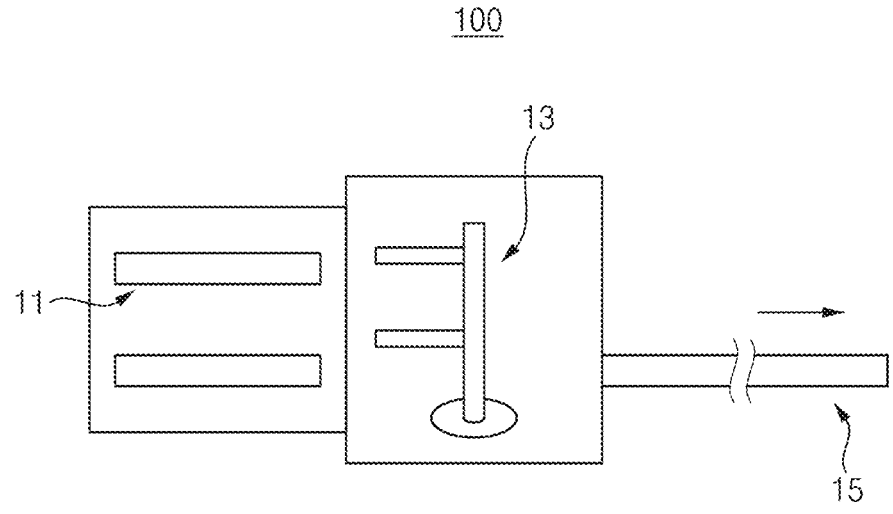
FIG. 1 is a schematic cross-sectional view illustrating an apparatus for processing a substrate in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
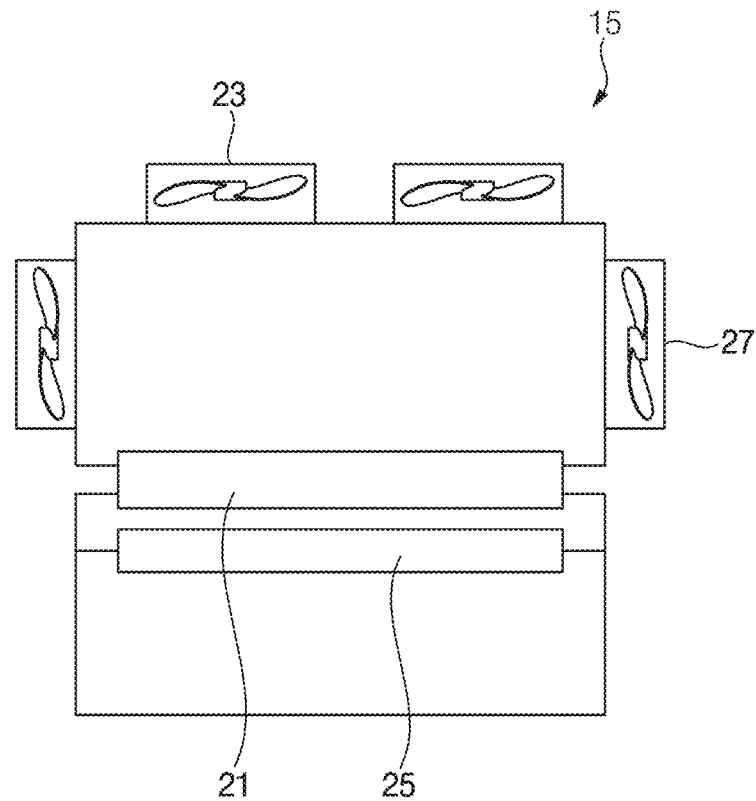
FIG. 2 is a schematic cross-sectional view illustrating a cooling unit in accordance with example embodiments of the invention.

FIG. 1 is a schematic cross-sectional view illustrating an apparatus for processing a substrate in accordance with example embodiments of the invention. FIG. 2 is a schematic cross-sectional view illustrating a cooling unit in accordance with example embodiments of the invention.

An apparatus for processing a substrate 100 illustrated in FIG. 1 may be employed in processes of heating and cooling a substrate for manufacturing an integrated circuit device such as a semiconductor device or a display device. For example, the apparatus for processing a substrate 100 may used in a process of heating a substrate and cooling a heated substrate before and/or after a chemical liquid including photoresist is coated on the substrate for manufacturing the display device. Further, the apparatus for processing a substrate 100 may be employed in processes of heating a substrate and cooling a heated substrate before and/or after a chemical liquid including a developing solution is provided onto the substrate for forming patterns in the substrate.

In processes of manufacturing the display device or the semiconductor device, the substrate may be levitated over a floating stage, and then the chemical liquid including photoresist may be coated on the substrate or the chemical liquid including the developing solution may be sprayed onto the substrate while moving the substrate over the floating stage. In example embodiments, the apparatus for processing a substrate 100 may be located prior to the floating stage or next to the floating stage.

In the processes of manufacturing the display device or the semiconductor device, the process of heating the substrate to a predetermined temperature may be performed in order to make the substrate to fit successive process conditions, or make the chemical liquid including the photoresist or the developing solution coated on the substrate to fit the successive process conditions. For example, the process of heating the substrate may be executed so as to increase an adhesion between the photoresist and the substrate before coating the chemical liquid including the photoresist on the substrate. In addition, the process of heating the substrate may be performed so as to remove a solvent remaining in a photoresist film formed on the substrate and to cure the photoresist film after coating the chemical liquid including the photoresist on the substrate. Meanwhile, the process of heating the substrate may be performed in order to improve a profile at a boundary between an exposed portion and an unexposed portion of the photoresist film formed on the substrate before providing the chemical liquid including the developing solution onto the substrate. Further, the process of heating the substrate may be carried out so as to strengthen a photoresist pattern formed on the substrate after providing the chemical liquid including the developing solution onto the substrate.

In the processes of manufacturing the display device or the semiconductor device, the process of cooling the substrate may be executed so as to reduce a thermal stress generated in the heated substrate.

In example embodiments, the process of heating the substrate may be performed at a temperature between about 100° C. and about 120° C. Further, the process of cooling the substrate may be performed at temperature between about 20° C. and about 25° C.

For the above-described processes of heating the substrate and of cooling the substrate, the apparatus for processing a substrate 100 may include a heating unit configured to heat the substrate, a cooling unit configured to cool the heated substrate, and a transfer unit configured to transfer the substrate between the heating unit and the cooling unit. In example embodiments, the heating unit may include a heating plate 11 and the cooling unit may include a cooling conveyor 15. Additionally, the transfer unit may include a transfer part 13 capable of transferring the substrate from the heating plate 11 onto the cooling conveyor 15.

As illustrated in FIG. 1, the heating plate 11 may heat the substrate placed thereon to a predetermined temperature. Particularly, the heating plate 11 may heat the substrate in a stationary state. In example embodiments, the heating plate 11 of the apparatus for processing a substrate 100 may include at least two plates arranged in a multi stage configuration. For example, the heating plate 11 may include two plates disposed in parallel.

The cooling conveyor 15 of the apparatus for processing a substrate 100 may cool the heated substrate placed thereon to a predetermined temperature. In particular, the cooling conveyor 15 may cool the heated substrate while transferring the substrate thereon. To this end, the cooling conveyor 15 of the apparatus for processing a substrate 100 may include a conveyor 21 configured to transfer the heated substrate and a first cooling part 23 configured to provide a cooling atmosphere relative to the heated substrate transferred on the conveyor 21.

The conveyor 21 may be configured to move the heated substrate from an arbitrary position to another position relatively away from the arbitrary position. For example, the conveyor 21 may move the heated substrate transferred from the heating plate 11 to a position relatively away from the heating plate 11.

The first cooling part 23 may be configured to provide the cooling atmosphere to the heated substrate transferred on the conveyor 21. The first cooling part 23 may be spaced apart from the heated substrate by a predetermined distance. The first cooling part 23 may provide a cooling air onto the heated substrate over the conveyor 21. For example, the first cooling part 23 may include a heat exchanger, an air cooler, etc.

In some example embodiments, the cooling conveyor 15 may additionally include a second cooling part 25 and a third cooling part 27 besides the first cooling part 23.

As illustrated in FIG. 2, the second cooling part 25 may be configured to provide another cooling atmosphere onto a bottom of the heated substrate from a lower portion of the conveyor 21. The third cooling part 27 may be configured to provide still another cooling atmosphere onto a side of the heated substrate from a side of the conveyor 21.

In some example embodiments, the second cooling part 25 may allow a cooling fluid to flow along the bottom of the conveyor 21. For example, the second cooling part 25 may include a cooling line disposed under the conveyor 21. The third cooling part 27 may locate adjacent to the side of the conveyor 21 and may provide a cool air onto the side of the heated substrate. For example, the third cooling part 27 may include a heat exchanger, an air cooler, etc. Thus. The third cooling part 27 may be substantially the same as or similar to the first cooling part 23.

As described above, the apparatus for processing a substrate 100 may include the heating plate 11 configured to perform the heating process on the substrate in the stationary state and the cooling conveyor 15 configured to execute the cooling process about the heated substrate while transferring the heated substrate.

Referring now to FIG. 1, the transfer part 13 may move the heated substrate from the heating plate 11 onto the cooling conveyor 15. The transfer part 13 may be disposed between the heating plate 11 and the cooling conveyor 15. Particularly, the transfer part 13 may transfer the heated substrate while holding the heated substrate in a face to face contact with a bottom face of the heated substrate. For example, the transfer part 13 may include a blade on which the heated substrate is placed.

In some example embodiments, the transfer part 13 may include a robot arm connected to the blade. Here, the robot arm may pivot or move in an upward direction and a downward direction. Alternatively, the robot arm may include at least one articulated element. Therefore, the heated substrate may be exactly and stably placed on the heating plate 11 or transferred from the heating plate 11 onto the cooling conveyor 15 using the transfer part 13 including the blade and the robot arm. In other words, the robot arm may load the substrate on the heating plate 11 while the blade stably holds the substrate. Additionally, while the blade stably holds the heated substrate, the robot arm may unload the heated substrate from the heating plate 11 and then may exactly move the heated substrate onto the cooling conveyor 15.

In some example embodiments, when the heating plate 11 has the multi stage structure including the at least two places, the transfer part 13 may also has a multi stage structure including at least two blades corresponding the at least two plates, respectively. Using the heating plate 11 and the transfer part 13 having such configurations, the substrate may be efficiently heated and the heated substrate may be more efficiently and stably transferred from the heating plate 11 onto the cooling conveyor 15. Specifically, when a substrate is not placed on one plate of the at least two plates while a substrate is located on the other plate of the at least two plates and the heating process is performed on the substrate, one of the at least two blades may place a new substrate on the one plates and the other of the at least two blades may transfer a heated substrate form the other plate onto the cooling conveyor 15.

In example embodiments, a process of treating a substrate may have four steps when the process of treating is executed using the transfer part 13 including two blades and the heating plate 11 including two plates. Specifically, the process of treating a substrate may include a first step in which a substrate is transferred from an outside into the apparatus for processing a substrate 100, a second step wherein the transferred substrate is loaded on one plate, a third step in which a heated substrate is unloaded from another plate, and a fourth step wherein the unloaded heated substrate is transferred onto the cooling conveyor 15.

In the conventional apparatus for processing a substrate, the conventional process for treating a substrate may include six steps when the process for treating a substrate is performed using the transfer part including two blades, the heating plate including two plates and the cooling conveyor including two cooling plates. Specifically, the conventional process of treating a substrate may include a first step wherein a substrate is transferred from an outside into the conventional apparatus for processing a substrate, a second step in which the transferred substrate is loaded on one plate, a third step in which a heated substrate is unloaded from another plate, a fourth step in which the unloaded heated substrate is transferred onto one cooling plate, a fifth step wherein a cooled substrate is unloaded from another cooling plate, and a sixth step wherein a cooled substrate is transferred from the conventional apparatus for processing a substrate to the outside.

According to example embodiments, the apparatus for processing a substrate 100 may reduce the process steps, particularly the process steps performed using the transfer part 13, and thus the apparatus for processing a substrate 100 may efficiently reduce the process time of the process of treating a substrate. When the apparatus for processing a substrate 100 was employed in the real manufacturing line, the process time of the process of treating a substrate was considerably decreased from about 45 seconds to about 35 seconds in comparison with the process time of the conventional process of treating a substrate. Further, the apparatus for processing a substrate 100 may reduce the movement of the substrate in the process steps so that the apparatus for processing a substrate 100 may prevent the generation of particles in the process of treating a substrate. Moreover, the apparatus for processing a substrate 100 may reduce manufacturing costs for the display device or the semiconductor device since the apparatus for processing a substrate 100 may include the relatively inexpensive cooling conveyor 15 instead of the conventional multi stage cooling plates.

Figure 3:
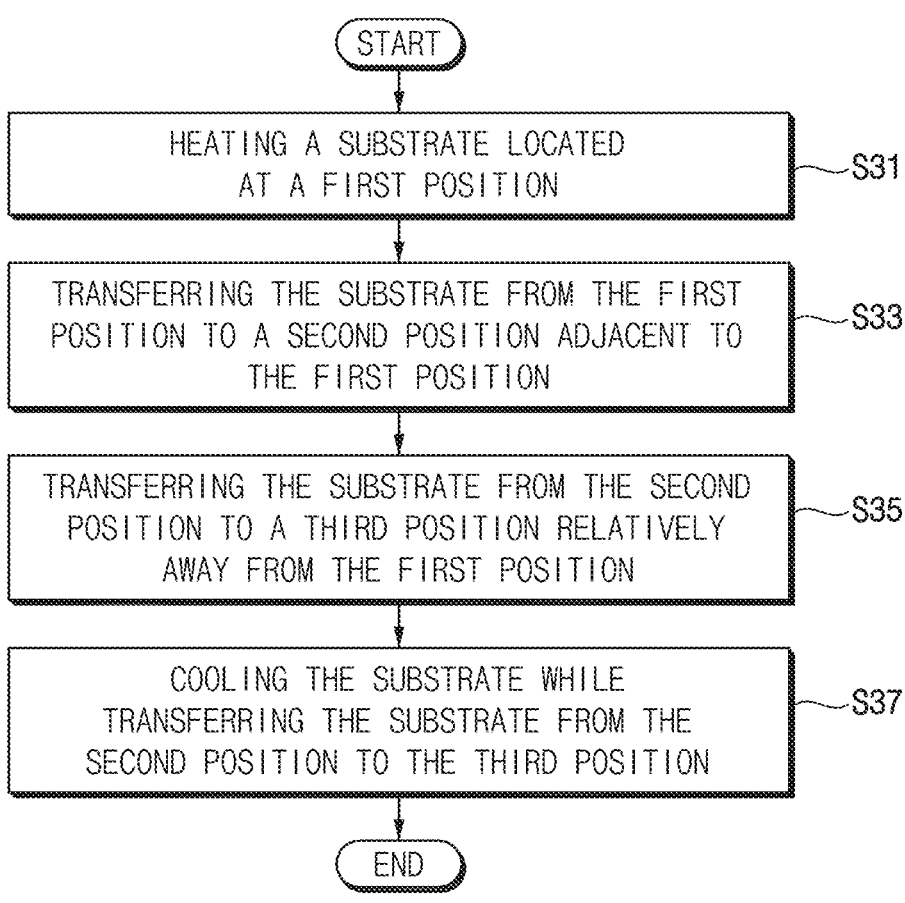
FIG. 3 is a flow chart illustrating a method of processing a substrate in accordance with example embodiments of the invention.

FIG. 3 is a flow chart illustrating a method of processing a substrate in accordance with example embodiments of the invention.

Referring to FIG. 1 and FIG. 3, in step S31, a substrate placed in a stationary state may be heated at a first position. The heating plate 11 may be disposed at the first position. In some example embodiments, when the heating plate 11 has the multi stage structure including the at least two plates, at least two first positions corresponding the at least two plates may exist in the apparatus for processing a substrate 100.

In step S33, after a process of heating the substrate is completed, a heated substrate may be transferred from the first position to a second position. In this case, the second position may be adjacent to the first position. For example, the second position may exist at an entrance of the cooling conveyor 15. The transfer part 13 may be disposed between the first position and the second position. That is, using the transfer part 13, the heated substrate may be transferred from the heating plate 11 corresponding to the first position to the entrance of the cooling conveyor 15 corresponding to the second position.

In some example embodiments, when the two first positions are provided in the apparatus for processing a substrate 100, a new substrate may be placed at one first position and the heated substrate may be transferred from the other first position to the second position. That is, using the transfer part 13 having the two blades, the new substrate may be heated at the one first position whereas the heated substrate may be moved to the second position from the other first position. In other words, new substrate may be sequentially loaded at the two first positions and heated substrates may be sequentially unloaded from the two first positions.

In step S35, the heated substrate may be transferred from the second position to a third position relatively away from the first position. That is, using the cooling conveyor 15, the heated substrate may be moved from the second position to the third position. For example, the third position may exit at an exit of the cooling conveyor 15, In step S37, the heated substrate may be cooled while the heated substrate is transferred from the second position to the third position. In example embodiments, the heated substrate may be cooled by providing a cool air onto the heated substrate from a heat exchanger or an air cooler while moving the heated substrate on the conveyor 21. In some example embodiments, the heated substrate may be additionally cooled by allowing a cooling fluid to flow in a cooling line disposed under the conveyor 21. In other example embodiments, the heated substrate may be additionally cooled by providing a cool air onto a side of the heated substrate from a heat exchanger or an air cooler.

In the method of processing a substrate according to example embodiments, a heating process may be performed on a substrate placed in a stationary state and a cooling process may be executed about a heated substrate while transferring the heated substrate. Particularly, a plurality of substrate may be sequentially heated and continuously cooled using a heating plate including at least two plates, a transfer part including at least two blades and a cooling conveyor. In other, as described above, it may be accomplished a method of processing a substrate which may include a first step in which a substrate is transferred from an outside into an apparatus for processing a substrate, a second step wherein the transferred substrate is loaded on one plate, a third step in which a heated substrate is unloaded from another plate, and a fourth step wherein the unloaded heated substrate is transferred onto the cooling conveyor. Therefore, a process time of the process steps may be greatly decreased using the apparatus for processing a substrate. Additionally, the apparatus for processing a substrate may reduce the movement of the substrate in the process steps to thereby prevent the generation of particles in the method of processing a substrate. Furthermore, the apparatus for processing a substrate may reduce manufacturing costs for the display device or the semiconductor device. Such apparatus for processing a substrate and such method of processing a substrate may be advantageously employed in a process for forming minute patterns on a substrate in manufacturing of a display device or a semiconductor device.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A cooling unit comprising:
a top wall;
a bottom wall opposite the top wall;

lateral walls connecting the top wall and the bottom wall;
a conveyor on the bottom wall and configured to transfer a substrate;
a first cooling part on the top wall and above the conveyor, the first cooling part being configured to cool the substrate while the substrate is being transferred on the conveyor, and the first cooling part being configured to provide a first cooling atmosphere relative to the substrate over the conveyor; and
a second cooling part adjacent to the lateral walls and adjacent to lateral sides of the conveyor, the second cooling part being configured to provide cool air on lateral sides of the substrate while the substrate is being transferred on the conveyor.

2. The cooling unit of claim 1, wherein the first cooling part is configured to provide cool air on the substrate that is on the conveyor.

3. The cooling unit of claim 1, further comprising a third cooling part on the bottom wall and below the conveyor, the third cooling part being configured to provide a second cooling atmosphere relative to the substrate under the conveyor.

4. The cooling unit of claim 3, wherein the second cooling part is configured to provide a third cooling atmosphere relative to the substrate at the lateral sides of the conveyor.

5. The cooling unit of claim 4, wherein the third cooling part is configured to allow a cooling fluid to flow under the substrate.

6. An apparatus for processing a substrate, the apparatus comprising:
a heating plate configured to heat the substrate placed thereon;
a cooling conveyor including a conveyor configured to transfer a heated substrate, and a first cooling part configured to cool the heated substrate while the heated substrate on the conveyor and configured to provide a first cooling atmosphere relative to the heated substrate over the conveyor; and
a transfer part configured to transfer the heated substrate from the heating plate onto the conveyor.

7. The apparatus of claim 6, wherein the heating plate has a multi stage structure including at least two plates and the transfer part has a multi stage structure including at least two blades corresponding to the at least two plates.

8. The apparatus of claim 7, wherein, when a substrate is not placed on a first plate of the at least two plates and a process of heating the substrate placed on a second plate of the at least two plates is completed, a first blade of the at least two blades is configured to load a substrate on the first plate and a second blade of the at least two blades is configured to unload the heated substrate from the second plate.

9. The apparatus of claim 6, wherein the first cooling part is configured to provide cool air onto the substrate over the conveyor.

10. The apparatus of claim 6, further comprising:
a second cooling part configured to provide a second cooling atmosphere relative to the substrate under the conveyor; and
a third cooling part configured to provide a third cooling atmosphere relative to the substrate at a side of the conveyor.

11. The apparatus of claim 10, wherein the second cooling part is configured to allow a cooling fluid to flow under the substrate and the third cooling part is configured to provide cool air onto a side of the substrate.

12. A method of processing a substrate, the method comprising:

heating the substrate in a stationary state at a first position, transferring a heated substrate from the first position to a second position adjacent to the first position, transferring the heated substrate from the second position to a third position relatively away from the first position, and cooling the heated substrate while transferring the heated substrate from the second position to the third position.

13. The method of claim 12, wherein two first positions are provided in an apparatus for processing the substrate, and wherein substrates are sequentially loaded at the two first positions and the substrates are sequentially unloaded from the two first positions.

14. The method of claim 13, wherein, when a substrate is not loaded at one first position of the two first positions and a process of heating the substrate loaded at a second first position of the two first positions is completed, a substrate is loaded at the one first position and the heated substrate is unloaded from the second first position.

15. The method of claim 14, wherein the two first positions exist on two plates, respectively, and the substrates are sequentially transferred from the two plates using two blades corresponding the two plates, respectively.

16. The method of claim 12, wherein the heated substrate is transferred from the second position to the third position using a conveyor.

17. The method of claim 16, wherein the heated substrate is cooled by providing cool air onto the heated substrate while the heated substrate from the second position to the third position.

18. The method of claim 17, wherein cooling atmospheres are provided at a side of the conveyor and under the conveyor while transferring the heated substrate from the second position to the third position.

19. The method of claim 18, further comprising providing the cool air onto a side of the heated substrate and allowing a cooling fluid to flow under the conveyor.

20. The method of claim 12, further comprising coating a chemical liquid including a photoresist on the substrate or providing a chemical liquid including a developing solution onto the substrate.

* * * * *